United States Patent [19]

Minuhin et al.

[11] Patent Number: 5,430,768
[45] Date of Patent: Jul. 4, 1995

[54] MAXIMUM LIKELIHOOD DETECTOR FOR A DISC DRIVE PRML READ CHANNEL

[75] Inventors: Vadim B. Minuhin; Vladimir Kovner; Steven V. Holsinger, all of Oklahoma City; Shafaollah Dahandeh, Norman, all of Okla.

[73] Assignee: Seagate Technology, Inc., Scotts Valley, Calif.

[21] Appl. No.: 309,870

[22] Filed: Sep. 21, 1994

[51] Int. Cl.⁶ .................................................. H03D 1/00
[52] U.S. Cl. .................................... 375/340; 375/290
[58] Field of Search ............... 375/39, 18, 94; 371/43; 307/353; 360/40; 364/244, 602, 258.1

[56] References Cited

U.S. PATENT DOCUMENTS

| | | | |
|---|---|---|---|
| 4,571,734 | 2/1986 | Dolivo et al. | 375/18 |
| 4,644,564 | 2/1987 | Dolivo et al. | 375/18 |
| 5,341,387 | 8/1994 | Nguyen | 375/101 |
| 5,373,400 | 12/1994 | Kovacs | 375/94 |
| 5,375,129 | 12/1994 | Cooper | 375/94 |
| 5,375,145 | 12/1994 | Abbott et al. | 375/18 |

OTHER PUBLICATIONS

M. J. Ferguson "Optimal Reception for Binary Partial Response Channels" pp. 493–505.
Roy D. Cideciyan, Francois Dolivo, Reto Hermann, Walter Hirt & Wolfgang Schott "A PRML System for Digital Magnetic Recording" pp. 38–56.

*Primary Examiner*—Stephen Chin
*Assistant Examiner*—T. Ghebretinsae
*Attorney, Agent, or Firm*—Bill D. McCarthy; Louis W. Watson; Edward P. Heller, III

[57] ABSTRACT

A maximum likelihood detector for a disc drive in which data files are stored along tracks as a sequence of magnetically written data elements that give rise to a signal in the disc drive read chapel. The detector includes even and odd Viterbi decoders that determine the most likely even and odd subsequences of data elements from even and odd samples of the signal and a postcoder that generates the most likely sequence of bits of encoded user data from the subsequences. Each Viterbi decoder includes an analog adder and an analog subtracter for generating the sums and differences of each sample and a reference signal, a sample and hold circuit codected to the adder and subtracter to receive the sums and differences, a difference circuit that generates the difference between the contents of the sample and hold circuit and each sample, a comparator assembly that generates a two bit merge indicator signal from the output of the difference circuit and the reference signal, AND gates that transmit bits of the indicator signal to switches in the sample and hold circuit for entering the sum or difference of the sample and reference signal into the sample and hold circuit, a shift register having interstate decoders that transmit logical 1's in response to a specific nonzero bit of the merge indicator signal and an indicator bit while otherwise transmitting a logic value determined by the logic value received from a preceding stage of the shift register and a pointer for generating indicator bits for each sample for which the merge indicator signal is logical 00.

3 Claims, 7 Drawing Sheets

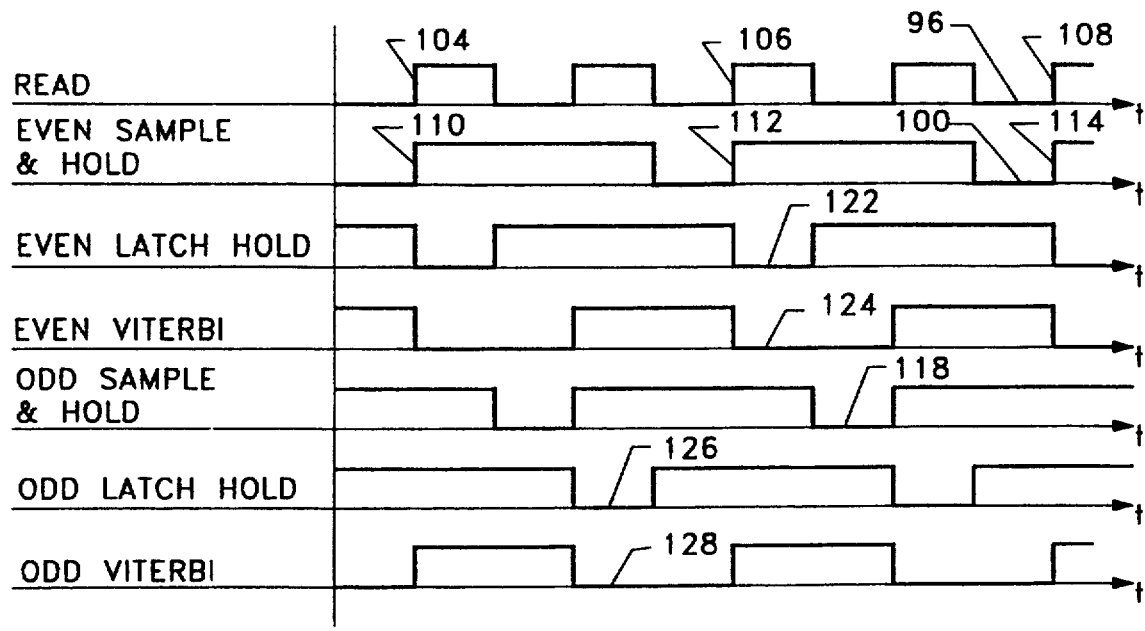
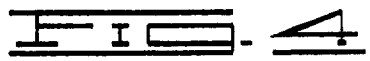
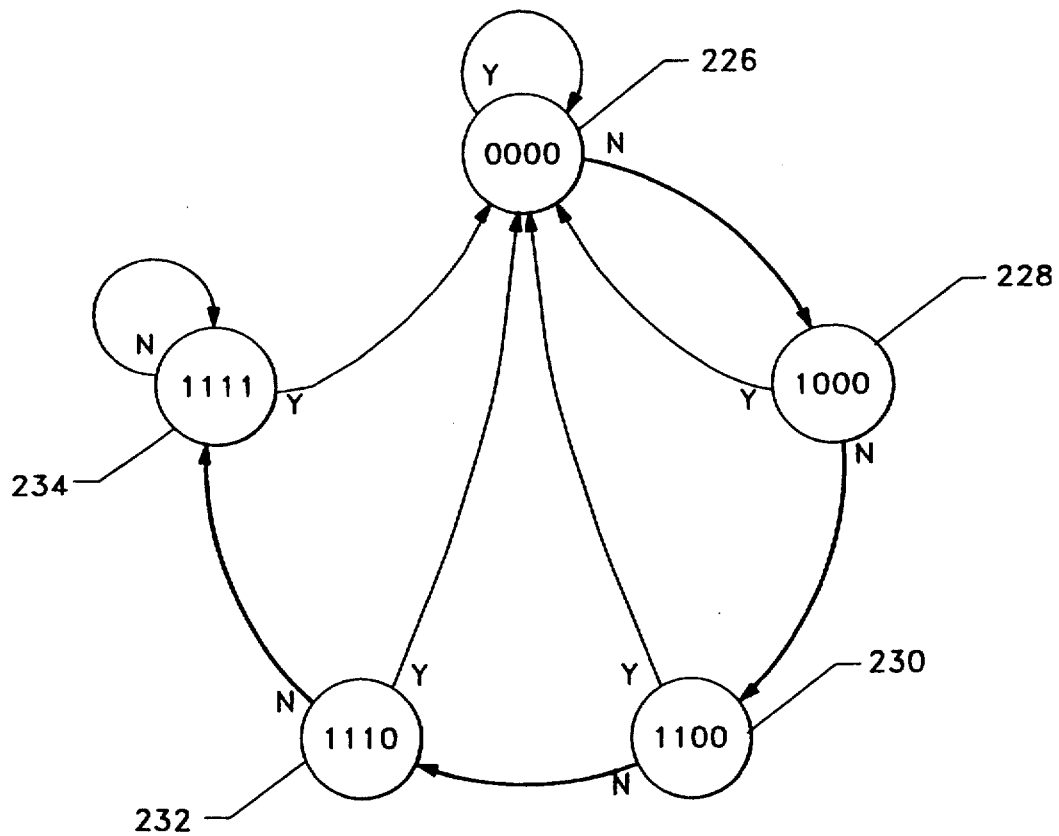
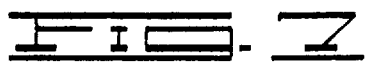

MAXIMUM LIKELIHOOD DETECTOR FOR A DISC DRIVE PRML READ CHANNEL

BACKGROUND OF THE INVENTION

1. Field of the Invention

The present invention relates generally to improvements in apparatus for retrieval of magnetically recorded data from a disc drive data track, and more particularly, but not by way of limitation, to improvements in apparatus for implementing the Viterbi algorithm in a disc drive PRML read channel.

2. Brief Description of the Prior Art

In disc drives used to store computer files, the files are stored along concentric data tracks defined in magnetizable coatings on the surfaces of rotating discs. To this end, write heads are positioned adjacent the disc surfaces and are radially movable to align with a track selected to store a file so that the track can be magnetized by passing a current through the write head. The direction in which the data track is magnetized is determined by the direction of the current through the write head so that a file can be stored by magnetizing the track in a pattern that is derived from the file. More particularly, the write head current is supplied by a write driver to which a sequence of bits derived from the file is clocked and the direction of the current in each clock period is determined by the logic values of bits received by the write driver. (As is known in the art, it is common practice to encode user data prior to storage on a disc.) Consequently, successive segments of the data track will be magnetized in a pattern that reflects the contents of the file. The magnetized track segments, or data elements, in turn, produce a magnetic field that can be sensed by a read head to generate an electrical signal that varies with time in a way that reflects the sequence of data elements along the data track to permit recovery of the file.

In a conventional disc drive, the write driver reverses the direction of the current through the write head each time a logical 1 occurs in the sequence of bits received by the write driver to, in turn, reverse the direction of magnetization of the magnetic medium along the track each time a logical 1 occurs in the sequence. During subsequent reading, each reversal in the magnetization of the data track, a so-called flux transition, gives rise to a peak in the signal generated by the read head and peak detection circuitry is used to place the peaks within "read windows" established by a phase locked loop that receives signals from the peak detection circuitry to establish a read clock that is synchronized with the passage of flux transitions by the read head. More particularly, the occurrence of a signal peak within a read window is an indicator of a flux transition along the data track. Consequently, since the flux transitions are generated by logical 1's in the encoded user file, the occurrence of a signal peak indicates a logical 1 in the sequence of data bits that were received by the write driver. The read phase locked loop is then used to clock logical 1's for those read windows in which peaks are detected, and logical 0's for those read windows in which peaks are not detected, to circuitry which regenerates the stored file.

While conventional disc drives which make use of the above scheme are able to operate reliably to store large quantities of data, it has become increasingly difficult to push the data storage capacity of disc drives of this type to higher and higher levels that are demanded by users of disc drives. More particularly, the data storage capacity of a disc drive depends upon the transfer rate of data bits between the write head and a data track and between the data track and a read head and problems have arisen with increasing the transfer rates of drives of the generic type.

Several effects tend to limit transfer rate in conventional disc drives. The synchronization between the read clock and the passage of flux transitions by the read head depends upon the correspondence between peaks in the signal induced in the read head and passage of individual flux transitions by the read head. However, the magnetic field from which the read head signal is derived is a superposition of the magnetic fields produced by all of the flux transitions on the disc. Consequently, as the transfer rate is increased, to decrease the spacing of flux transitions along a data track, so-called "intersymbol interference"; that is, significant superposition of magnetic fields from successive flux transitions on a data track, causes peaks in the read head to be shifted in time from the times that such peaks would occur for an isolated flux transition. While the effects of peak shift can be minimized; for example, by pulse slimming, encoding of user data and prewrite compensation, it remains a problem with peak detect disc drives that limits the transfer rate of data in such a disc drive.

Moreover, the superposition of magnetic fields of successive flux transitions gives rise to a second problem. The fields produced by adjacent flux transitions superpose destructively so that the magnitude of the signal induced in a read head by passage of a flux transition decreases with increasing transfer rate. Consequently, the signal to noise ratio of the output of the read head decreases with increasing transfer rate to increase the number of errors that occur during the reading of data. While, as in the case of peak shift, corrective measures; for example, adaptive signal filtering and the use of error detection and correction circuitry, can be taken, it becomes increasingly difficult to employ these measures as the transfer rate is increased. The net result is that, while room for improvement of disc drives that make use of peak detection circuitry may still exist, the improvements are achieved only by measures that are becoming increasingly difficult and expensive to employ.

Because of this difficulty in increasing the data transfer rate in disc drives employing peak detection in the read channel, practitioners have, in recent years, turned to the use of so-called PRML read channels in disc drives. In disc drives of this type, partial response signaling is utilized to control, rather than to suppress, intersymbol interference and the effect of noise is minimized by the use of maximum likelihood detection of the magnetization of sequences of segments of the data track. To this end, signals corresponding to individual flux transitions are filtered to a signal which, in the absence of noise, would have a nominal form and the signals are then sampled at times determined in relation to this nominal form for maximum likelihood detection in which each bit of encoded data is recovered in the context of the sequence of bits that were written to the disc to limit the effect of noise.

More particularly, filtering the individual flux transition signal to a particular wave form results in samples that, in the presence of intersymbol interference and in the absence of noise, can have only specific values that are determined by the totality of data elements along a data track being read. Consequently, by appropriately precoding previously encoded user data so that the encoded data bits can be written in terms of the data elements that are written to a data track, using the samples to determine the sequence of data elements along the data track during reading, and then postcoding the sequence of data elements in accordance with the precoding relationship, the encoded user data can be recovered for decoding and return to a computer.

The effect of noise in the determination of the sequence of data elements is limited by maximum likelihood detection of the data elements using a scheme that has been described, for class IV partial response signaling that is used in the present invention, by M.J. Ferguson in "Optimal Reception for Binary Partial Response Channels", The Bell System Technical Journal, Vol. 51, No. 2, February 1972, pp 493–505. In this scheme, referred to as the Viterbi algorithm, the samples are used to determine the most likely sequence of data elements along the track in accordance with a criterion that takes noise in the samples into account. More particularly, a retrospective test is applied following the reception of each sample to determine whether the most likely value of the first of two data elements that would determine the sample magnitude in the absence of noise can be determined in accordance with the criterion. If not, the most likely value of the second of these two data elements is the same as the most likely value of the first. Thus, once the test yields the most likely value for one data element, it yields the most likely values of data elements back to the last element for which a positive test result was achieved. Thus, each time a positive result is achieved the most likely sequence of data elements preceding the positive result will be known so that most likely sequence of bits of the encoded user file, to the time the sample is taken, can be determined.

In prior art disc drives which make use of partial response signaling and maximum likelihood detection, the practice has been to digitize the signal induced in the read head by passage of flux transitions and implement the Viterbi decoder used to recover the data elements in digital circuitry. However, there are drawbacks to the use of such an approach. Thus, for example, complex circuitry is required to achieve a high resolution of sample amplitudes expressed in digital form and a low resolution limits the effectiveness of the circuitry used for maximum likelihood detection. Moreover, if the digitization is carried out in the filtering of the signals to the nominal form, as is the standard practice, proper timing of the sampling becomes increasing difficult. Since improper timing will result in sample values that differ from the samples determined from the nominal wave form, the effect is the same as the introduction of increased noise levels into the samples. Thus, digital implementation of maximum likelihood detection circuitry tends to limit the extent to which the advantages of partial response signaling and maximum likelihood detection over peak detection used in conventional disc drives can be achieved.

Further, the manner in which the Viterbi algorithm determines the most likely sequence of data elements along a data track gives rise to a second problem. Since the test employed in the algorithm is retrospective and, further, since the test may not yield a positive result for a series of samples, the most likely sequence of data elements generally will not be determined as each sample is taken. Rather, the algorithm determines sequences of data elements after a varying number of samples have been taken. Consequently, some means must be employed to delay the output of the sequences until a determination has been made. This delay requirement can also give rise to complexities in circuitry used to implement the algorithm.

SUMMARY OF THE INVENTION

The present invention provides a maximum likelihood detector in which the Viterbi algorithm is implemented, in large part, in analog circuitry to eliminate the need for digitization of samples of signals induced in the disc drive read channel and the problems attendant thereto. Moreover, the maximum likelihood detector of the present invention employs a novel scheme, that avoids the use of complex circuitry, for delaying the output of data between positive tests that determine the most likely sequence of data elements along a data track and, consequently, the most likely sequence of data bits stored to a data track during writing.

To these ends, the maximum likelihood detector of the present invention is comprised of an even Viterbi decoder that receives an even subsequence of samples of the signal in a PRML read channel of a disc drive and generates the most likely values of the even data elements giving rise to the samples; an odd Viterbi decoder that similarly receives an odd subsequence of samples of the signal and generates the most likely values of the odd data elements giving rise to the odd samples; and a postcoder that receives the most likely data samples from both decoders and generates the most likely sequence of data bits that were stored to the data track being read.

In order to generate the data elements in accordance with the Viterbi algorithm, each Viterbi decoder is comprised of an analog adder that adds a reference signal to each sample and an analog subtracter that subtracts the reference signal from each sample. Consequently, and in accordance with the Viterbi algorithm, the adder will contain a possible value of a difference of survivor metrics, used in carrying out the test, for the next sample while the subtracter will contain a second possible value for such difference. Each Viterbi decoder is further comprised of a sample and hold circuit that receives the sum at one input and the difference at a second input to permit an appropriate survivor metric difference to be stored for future testing should the test made in the present sample period yield positive results.

A difference circuit connected to the output of the sample and hold circuit determines the difference between the contents of the sample and hold circuit and the sample to provide the quantity which is used in the test. Specifically, the Viterbi decoder is comprised of an analog comparison circuit that compares the contents of the difference circuit to the reference signal to generate a two-bit digital merge indicator signal that will have the value 01 or the value 10 for a positive result and the value 00 for a negative result. The bits of the merge indicator signal are transmitted to a sample and hold update circuit that provides one update signal to the sample and hold circuit, to enter the sum of the sample and the reference signal, and provides a second update signal, to enter the difference between the sample and the reference signal, should either bit be a logical 1 as is in accord with the Viterbi algorithm.

Each Viterbi decoder is further comprised of a pointer circuit that receives the merge indicator signal and stores, in a succession of storage locations, an indication of each negative test result; that is, a merge indicator signal that can be expressed as 00. One bit of the merge indicator signal is transmitted to a shift register, of which each Viterbi decoder is further comprised, for entry of a sequence of bits having a specific logical value between positive tests and the shift register is comprised of a series of flip flops interconnected with decoders which also receive the indications of negative results. A truth table is selected for the decoders which will cause the decoders to transmit the bit stored in one stage of the shift register to the next stage in all but one circumstance; that is, the bit received by the shift register has a specific logic level and, further, one input of the decoder, connected to a storage location of the pointer circuit, receives a logical value corresponding to a stored indication of a negative test result. In such circumstance, the complement of the bit stored in the previous stage will be transmitted to the next stage of the shift register. By entering a specific logic value in the shift register between positive results for the merge test and transferring the bit in each stage of the shift register to the next in all but a limited set of circumstances, economies can be achieved in the structure of the Viterbi decoders to not only limit the cost of the decoders but to also enhance the reliability of the decoders.

An important object of the present invention is to provide a maximum likelihood detector for a disc drive that avoids problems attendant with the use of digital circuitry in such a detector.

Another object of the invention is to provide a maximum likelihood detector that can be implemented in relatively uncomplicated circuitry.

Yet a further object of the present invention is to provide a maximum likelihood detector that combines high resolution sampling of signals for detection in accordance with the Viterbi algorithm with a low cost of implementation of the detector.

Still another object of the present invention is to enhance the reliability of Viterbi decoders for disc drives that employ partial response signaling in conjunction with maximum likelihood detection.

Other objects, features and advantages of the present invention will become apparent from the following detailed description when read in conjunction with the drawings and appended claims.

DESCRIPTION OF THE DRAWINGS

FIG. 4 is a timing diagram for the clock generator shown in FIG. 3.

FIG. 7 is a state diagram showing the operation of the pointer of FIG. 6.

DESCRIPTION OF THE RECORDING CHANNEL

Figure 1:
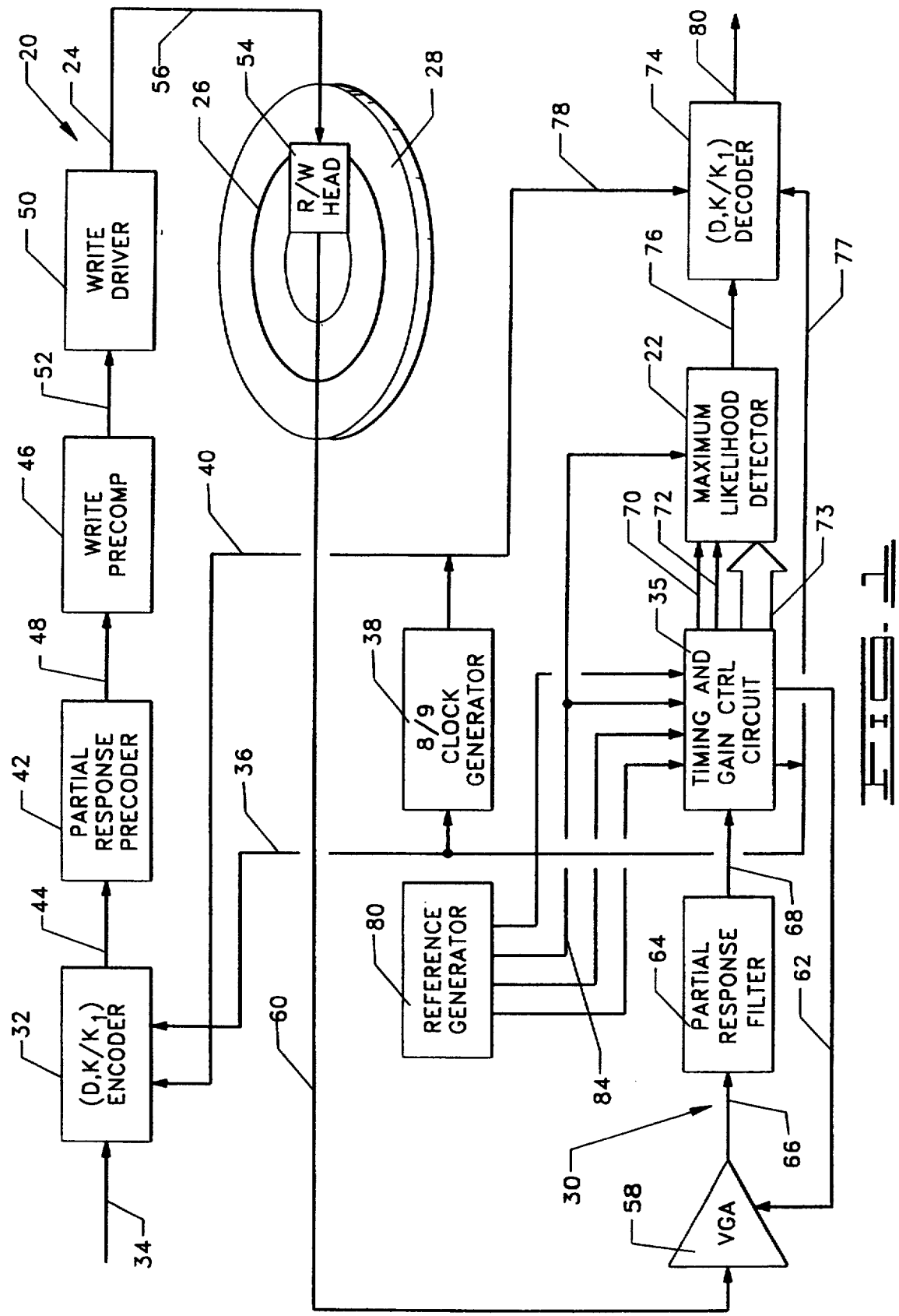
FIG. 1 is a block diagram of a PRML recording channel including the maximum likelihood detector of the present invention.
Figure 2:
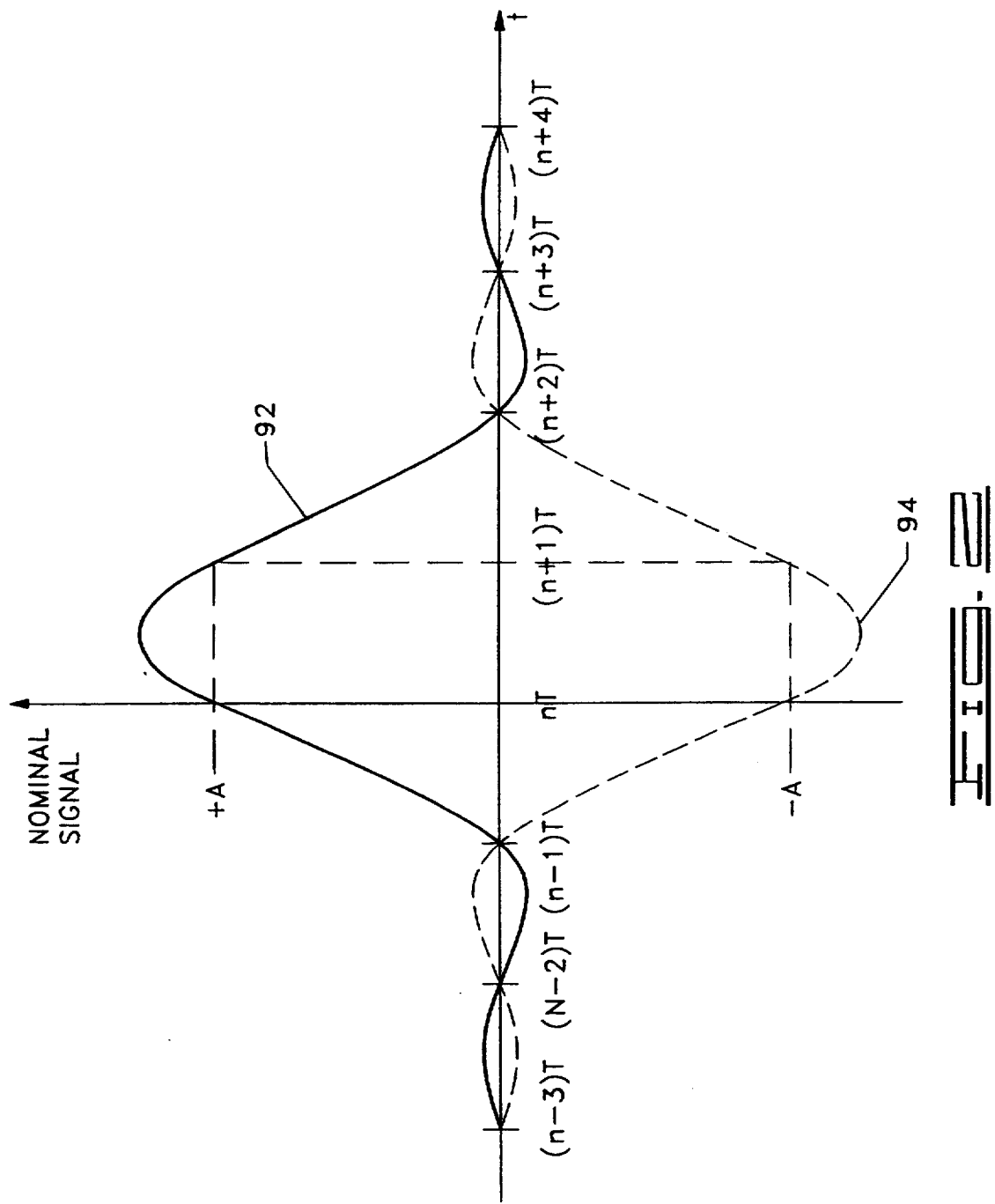
FIG. 2 is a graph of the class IV partial response wave form to which signals in the read channel of the PRML recording channel of FIG. 1 are filtered.

In order to place the invention in context, it will be useful to briefly discuss the structure and operation of a PRML recording channel. FIGS. 1 and 2 have been included for this purpose.

Shown in FIG. 1 and designated by the general reference number 20 is a block diagram of a PRML recording channel for a disc drive that includes a maximum likelihood detector 22 constructed in accordance with the present invention. In general, the recording channel 20 is comprised of a write channel, generally indicated at 24 in FIG. 1, which is operated in a write mode of the recording channel to store computer programs and user files along data tracks, such as the data track 26, on a rotating disc 28, and a read channel, generally indicated at 30, that retrieves stored files in a read mode of operation of the recording channel 20.

As is conventional, the write channel 24 is comprised of an encoder 32 that receives data bits of a user file on a signal path 34 during the storage of the file and encodes the user data in response to timing signals received from a timing circuit 35 on a signal path 36 and from an 8/9 clock generator 38 on a signal path 40. More particularly, the clock generator 38 receives clock signals on the signal path 36 and generates a clock at 8/9 the frequency of the clock provided on the signal path 36 by the timing and gain control circuit 35.

The encoder 32 provides 9 bits of encoded data for each 8 bits of user data to a partial response precoder 42, on a signal path 44, that precodes the encoded data in a manner that is determined by the class of partial response signaling that has been selected for use in the recording channel 20. The present invention contemplates that such selected class of partial response signaling will be class IV signaling that has been described by Kabal et al. in "Partial Response Signaling", IEEE Transactions on Communications, Vol. Com-23, No. 9, pp 921-934, September 1975, pertinent features of which will be described below with respect to FIG. 2. In a disc drive that utilizes class IV partial response signaling, the precoder generates a sequence {b} of bits from the sequence {a} of bits of the encoded user data in accordance with the relation:

$$b_n = a_n \text{XOR } b_{n-2} \quad (1)$$

As will be clear to those of skill in the art, such relation implies the relation $$a_n = b_n \text{XOR } b_{n-2} \quad (2)$$

which is utilized in a manner to be discussed below.

The encoded and precoded data is transmitted to a write precompensation circuit 46, via a signal path 48, that selectively delays the transmission of bits of the data and thence to a write driver 50, via a signal path 52, that passes a current through a read/write head 54, via a signal path 56, in a direction determined by the logic value presently at the input of the write driver 50. The read/write head 54 is positioned adjacent a surface of the disc 28 and such surface is provided with a magnetizable surface coating so that currents passed through the read/write head 54 will magnetize segments of a data track 26 with which the read/write head is radially aligned to effect storage of data along the data track. Specifically, a pattern of successive data elements, each corresponding to one period of operation of the 8/9 clock generator 38, will be written to the data track by magnetizing the data track in one direction for one logical value in the sequence {b} defined in equation (1) and in the opposite direction for the other logical value in the sequence {b}. The encoder 32, the partial response precoder 42, write precompensation circuit 46, write driver 50, and read/write head 54 are conventional and operate conventionally during the storage of a user files so that they not be further described herein.

In a read mode of operation of the recording channel 20, passage of a magnetic flux transition between two data elements on a data track having opposite directions of magnetization with which the read/write head 54 is aligned induces an electrical signal in the head 54 and such signal is transmitted to a variable gain amplifier 58, via a signal path 60, that adjusts the amplitude of the signal in response to a gain error signal received from the timing and gain control circuit 35 on a signal path 62. Signals induced in the read channel by passage of flux transitions by the read/write head 54 are transmitted to a partial response filter 64 via a signal path 66 and thence, via a signal path 68, to the timing and gain control circuit 35. As has been discussed in U.S. Patent application Ser. No. 08/309,461 entitled "TIMING AND GAIN CONTROL CIRCUIT FOR A PRML READ CHANNEL" filed on even date herewith, the teachings of which are incorporated by reference, the timing and gain control circuit 35 periodically samples the signal in the read channel 30 during the read mode of operation and such samples are transmitted to the maximum likelihood detector 22, via signal paths 70 and 72 that transmit even and odd samples respectively. The timing and gain control circuit 35 further generates a plurality of clock signals, provided on signals paths that have been indicated by a bus 73, in FIG. 1, that are utilized in the operation of the maximum likelihood detector 22 in a manner to be discussed below. For the present, it will suffice to note that the maximum likelihood detector 22 operates in accordance with the Viterbi algorithm to determine the most likely sequence of data elements along the data track 26 and, from such sequence, the most likely sequence of values for the encoded user data bits. Specifically, the data elements are determined by the sequence {b} derived from the sequence {a} of encoded data bits during writing in accordance with equation (1) and the most likely estimate of the sequence {a} is generated by applying equation (2) to the most likely sequence of data elements during reading. The most likely estimate of the sequence {a} is transmitted to a decoder 74 via a signal path 76 which decodes the received sequence to recover data bits of the stored user file in response to clock signals received from the timing and gain control circuit 35 on a signal path 77 and from the 8/9 clock generator 38 on a signal path 78. The recovered bits are then transmitted, via a signal path 80, to components of the disc drive with which the present invention is not concerned for return to a host computer with which the disc drive is used. The variable gain amplifier 58 and decoder 74 are conventional and need not be further discussed herein for purposes of the present disclosure. A preferred construction for the partial response filter 64 is described in U.S. Patent application Ser. No. 08/309,912 entitled "FILTER SYSTEM FOR A PRML READ CHANNEL IN A DISC DRIVE", the teachings of which are incorporated herein by reference, filed on even date with the present application.

As will be discussed more fully below, the maximum likelihood detector 22 makes use of a reference voltage in the read mode of operation of the recording channel 20 and such reference voltage is provided by a conventional reference generator 82 via a signal path indicated at 84 in FIG. I. This reference voltage is defined with reference to a nominal signal, shown in FIG. 2 to which attention is now invited, to which signals induced in the read head 54 by passage of a flux transition on a data track 26 radially aligned with the read head would be filtered by the filter 64 in the absence of noise in the read channel 30 during the read mode of operation of the recording channel 20.

Referring to FIG. 2, shown therein in solid line at 92 is a graph of the signal ideally issuing from the filter 64 in response to passage of the a flux transition, considered to be the nth flux transition and assumed to have a positive polarity, by the read/write head 54. (For a flux transition having a negative polarity, the ideal signal would have the form shown in dashed line at 94.) The timing and gain control circuit 35 generates samples of the actual signal issuing from the filter 64 at nominal sample times which are referred to the nominal signal shown in FIG. 2; specifically, at the times which are shown as integral multiples of the time T which is equal to the reciprocal of the transfer rate of data to and from a selected data track on the surface of disc 28. The timing and gain control circuit 35, in combination with the variable gain amplifier 58, also adjusts the amplitude of the signal issuing from the filter 64 so that, in the absence of noise in the signal, the samples would have the magnitudes indicated for the sample times shown in FIG. 2 of $+A$, $O$, or $-A$. The reference generator 82 supplies a reference voltage of $+A/2$ on the signal path 84 for use in the maximum likelihood detector 22 as will be described below.

DESCRIPTION OF THE MAXIMUM LIKELIHOOD DETECTOR

Figure 3:
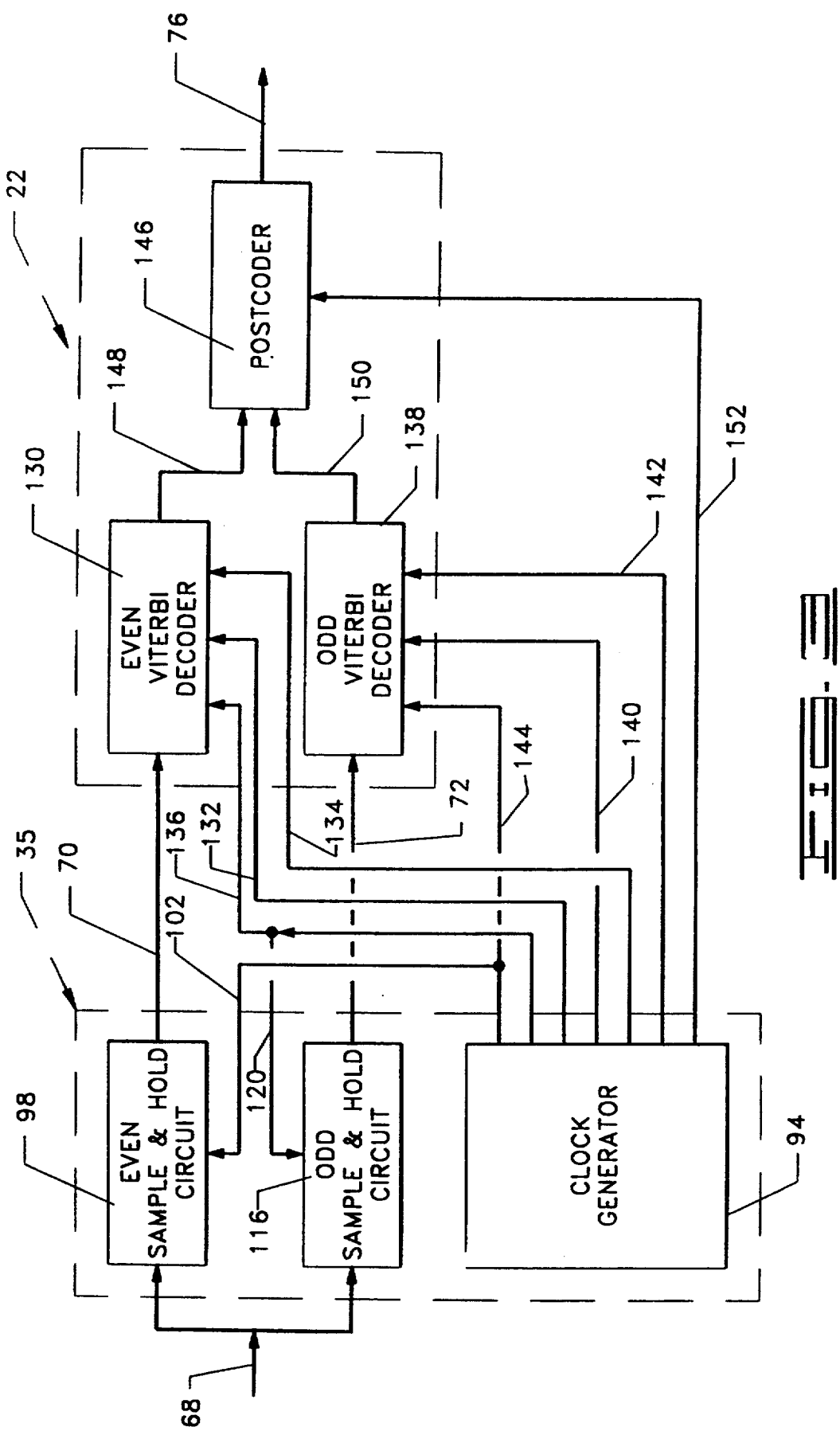
FIG. 3 is a block diagram of the maximum likelihood detector of FIG. 1.

Referring now to FIG. 3, shown therein is a block diagram of the maximum likelihood detector 22. Additionally, a block diagram illustrating pertinent features of the timing and gain control circuit 35 has been included in FIG. 3 to provide a basis for discussing signals received by the maximum likelihood detector 22 from the timing and gain control circuit 35 during the operation of the recording channel 20 in the read mode of operation.

Referring first to the timing and gain control circuit 35, such circuit is comprised of a clock generator 94 that generates clock signals utilized by the maximum likelihood detector in a manner that has been described in the aforementioned U.S. Patent application Ser. No. 08/309,461 entitled "TIMING AND GAIN CONTROL CIRCUIT FOR A PRML READ CHANNEL". Such clock signals include a read PLL clock signal having a frequency substantially equal to the transfer rate of data between the head 54 and the data track 26. (The frequency of the read PLL is varied to cause sampling of the signal issuing from the filter 64 at substantially the nominal sampling times illustrated in FIG. 2.) The read clock signal has been illustrated along the READ time line 96 of FIG. 4 to provide a basis for comparison of clock signals that are used in the operation of both the maximum likelihood detector 22 and the timing and gain control circuit 35.

The timing and gain control circuit 35 is further comprised of an even sample and hold circuit 98 that receives an EVEN SAMPLE & HOLD clock signal, shown on the time line 100 in FIG. 4, from the clock generator 94 on a signal path 102 in FIG. 3. The even sample and hold circuit 98 receives the signal at the output of the partial response filter 64 on the signal path 68 that has been carried into FIG. 3 from FIG. 4 and the filter output signal is entered into the even sample and hold circuit 98 by a rising edge of the EVEN SAMPLE & HOLD clock signal. Thus, the even sample and hold circuit 98 will enter samples of the filter output signal in response to every other READ clock cycle as can be seen by comparing rising edges 104, 106 and 108 of the READ clock signal with rising edges 110, 112 and 114 of the EVEN SAMPLE & HOLD clock signals.

The timing and gain control circuit 35 is also comprised of an odd sample and hold circuit 116 that receives ODD SAMPLE & HOLD clock signals, illustrated on the time line 118 of FIG. 4, on a signal path 120 to enter samples of the signal from the filter 66 in READ clock cycles that alternate with the read clock cycles in which samples are entered into the even sample and hold circuit 98.

Additional clock signals generated by the clock generator 94 include: an EVEN LATCH HOLD clock signal, time line 122 in FIG. 4, having rising edges delayed one half READ clock period behind the rising edges of the EVEN SAMPLE & HOLD clock signal; an EVEN VITERBI clock signal, time line 124, having rising edges delayed a half READ clock period behind the rising edges of the EVEN LATCH HOLD clock signal; an ODD LATCH HOLD clock signal, time line 126 in FIG. 4, having rising edges delayed one half READ clock period behind the rising edges of the ODD SAMPLE & HOLD clock signal; and an ODD VITERBI clock signal, time line 128, having rising edges delayed a half READ clock period behind the rising edges of the ODD LATCH HOLD clock signal. It will also be noted that the ODD SAMPLE & HOLD clock signal has a falling edge a half READ clock cycle behind the rising edge of the EVEN LATCH HOLD clock signal and that the EVEN SAMPLE & HOLD clock signal has a falling edge one half READ clock cycle behind the ODD LATCH HOLD clock signal. The temporal positioning of these clock edges are utilized to time events in the maximum likelihood detector 22 in a manner that will become clear below.

With continuing reference to FIG. 3, the maximum likelihood detector 22 is comprised of an even Viterbi decoder 130 that receives even samples of the signal in the read channel 30 from the even sample and hold circuit 98 via the signal path 70, the EVEN LATCH HOLD and EVEN VITERBI clock signals via signal paths 132 and 134 respectively, and the ODD SAMPLE & HOLD clock signal via a signal path 136 from the clock generator 94. An identical odd Viterbi decoder 138 similarly receives odd samples from the odd sample and hold circuit 116 via the signal path 72, ODD LATCH HOLD and ODD VITERBI clock signals via signal paths 140 and 142 respectively, and the EVEN SAMPLE & HOLD clock signal via a signal path 144 from the clock generator 94. As will be discussed below, the even Viterbi decoder 130 generates the most likely sequence of even data elements along a data track and the odd Viterbi decoder 138 generates the most likely sequence of odd data elements along a data track during reading of the track. These sequences are outputted to conventional postcoder 146, via signal paths 148 and 150, and the postcoder 146 responds to READ clock signals provided from the clock generator 94 on a signal path 152 to generate the most likely values of the even and odd subsequences of the sequence {a} of encoded user data bits and mixes the subsequences to recover the most likely sequence of encoded user data bits that were stored during a previous write operation of the recording channel 20.

DESCRIPTION OF THE VITERBI DECODER

Since, as has been noted, the even and odd Viterbi decoders 130 and 138 are identical, it will suffice for purposes of the present disclosure to discuss the construction of only the even Viterbi decoder 130. FIGS. 5 through 8 have been included for this purpose.

Figure 5:
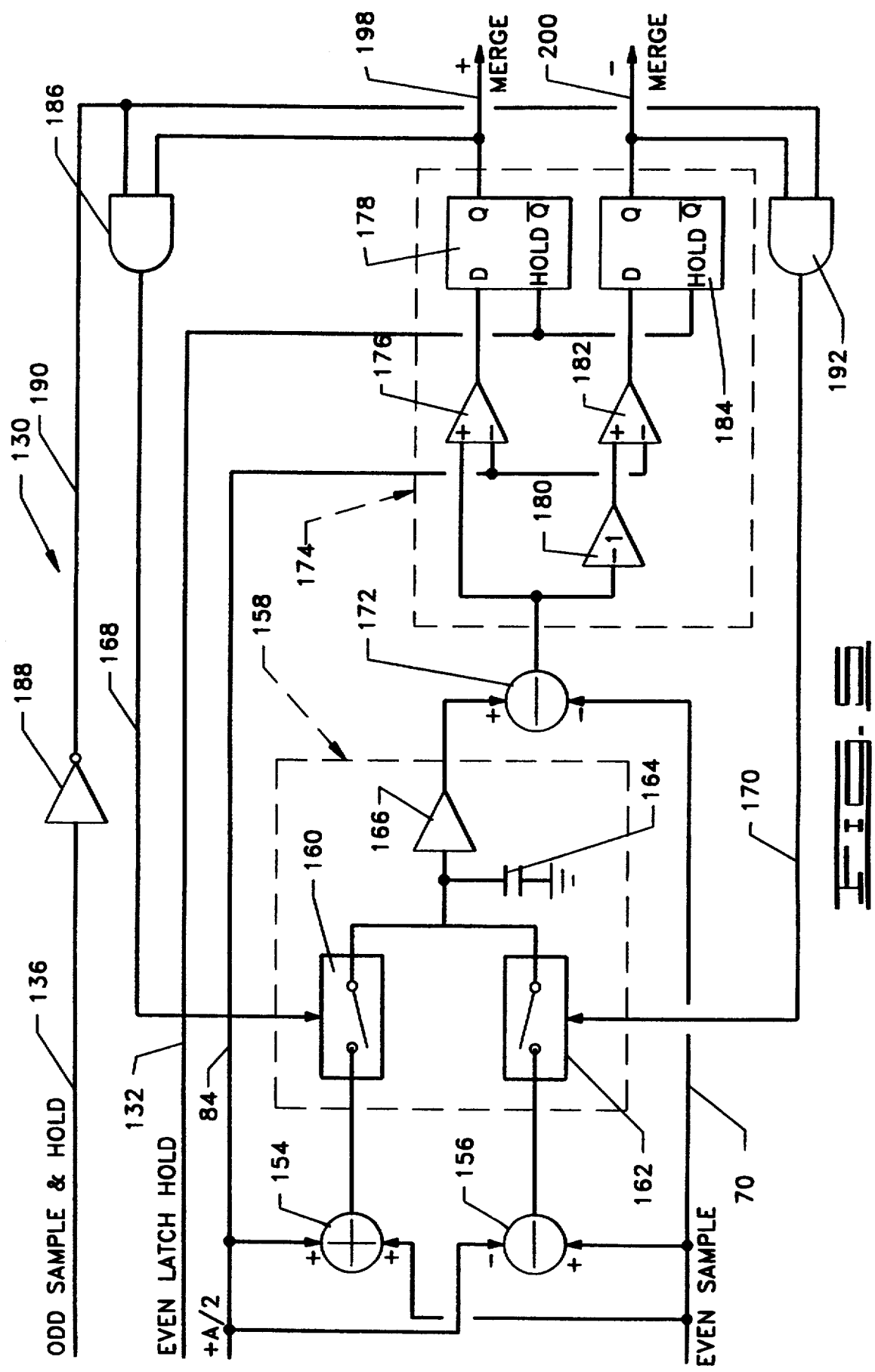
FIG. 5 is a block diagram of the merge detection and delta update circuit of the even Viterbi decoder.

Referring first to FIG. 5, the even Viterbi decoder is comprised of an analog adder 154 that receives even samples from the even sample and hold circuit 98 on the signal path 70 and receives the reference signal having the value $+A/2$, where A is the ideal sample value for the PR-IV wave form that has been indicated in FIG. 2, from the reference generator 82 on the signal path 84. Thus, the adder 154 generates the sum of the reference signal $+A/2$ and the sample that is currently stored in the even sample and hold circuit 98. Similarly, the difference between these two signals; that is, the sample value less the reference signal, is generated by an analog subtracter 156 similarly connected to the signal paths 70 and 82.

The even Viterbi decoder is further comprised of a sample and hold circuit 158 that is comprised of normally open switches 160 and 162 that receive the sum and difference, respectively, of the reference signal $+A/2$ and sample amplitude from the adder 154 and the subtracter 156. The outputs of the switches 160 and 162 are connected together and connected to one end of a capacitor 164 whose other end is connected to a ground corresponding to a nominal signal of zero referred to the graphs in FIG. 2. A buffer 166 having an input connected to the nongrounded terminal of the capacitor 164 completes the sample and hold circuit 158. As will be clear from the construction of the sample and hold circuit 158, such circuit can be caused to store the sum of the sample and the reference signal $+A/2$ generated by the adder 154 by closing the switch 160 via a signal on a signal path 168 to the control terminal of switch 160 or to store the difference between the sample value and the reference signal by closing the switch 162 via a signal on a signal path 170 to the switch 162 control terminal. The purpose of such storage will be discussed below.

The contents of the sample and hold circuit 158 are transmitted to the positive input of a subtracter 172 that also receives, at its negative input, each even sample on the signal path 70 from the even sample and hold circuit 98. Thus, the subtracter 172 generates the difference between the contents of the sample and hold circuit 158 and the present even sample being received by the even Viterbi decoder 130. In accordance with the Viterbi algorithm to be discussed below, this difference is utilized to carry out a so-called "merge" test each time a new even sample is received by the even Viterbi decoder 130.

The merge test is carried out by a comparison circuit 174 comprising a comparator 176 that receives the difference expressed at the output of the subtracter 172 at its noninverting input and receives the reference signal on the signal path 84 at its inverting input. The output of the comparator 176 is connected to the data input of a type D latch 178 so that a relatively high voltage, corresponding to a logical 1, will be impressed on the data input of latch 178 at such times that the difference between the contents of the sample and hold circuit 158 and the sample value presently being received exceeds the reference voltage $+\frac{1}{2}$ A supplied by the reference generator 82. Alternatively, if the difference expressed at the output of the subtracter is less than the reference signal $+\frac{1}{2}$ A, the output of the comparator 176 will be a relatively low voltage corresponding to a logical 0. The hold input of the latch 178 receives the EVEN LATCH HOLD clock signal on the signal path 132 so that, in accordance with the timing diagram of FIG. 4, a logic value indicative of the relative magnitudes of the difference expressed at the output of subtracter 172 and the reference signal $+\frac{1}{2}$ A will be entered into the latch 178 a half READ clock period after each even sample is taken.

The comparator 176 and latch 178 carry out a so-called "+merge" portion of the merge test. A so-called "—merge" portion is carried out by a unity gain, inverting amplifier 180, a comparator 182 and type D latch 184. More particularly, the amplifier 180 receives the difference expressed at the output of the subtracter 172 and provides the negative of such difference to the noninverting input of the comparator 182 whose inverting input receives the reference signal $+\frac{1}{2}$ A via the signal path 84 from the reference generator 82. Because of the inversion of the difference expressed at the output of subtracter 172 by the amplifier 180, the comparator 182 will be high at such times that the difference expressed at the output of the subtracter 172 is less than the negative of the reference signal received from the reference generator 82 and low at other times. The output of the comparator 182 is connected to the data input of latch 184 and the hold input of latch 184 receives the EVEN LATCH HOLD signal on the signal path 132 from the clock generator 94 so that a logical 1 will be entered into the latch 184 a half READ clock cycle after an even sample is taken if the difference between the contents of the sample and hold circuit 158 is less than the negative of the reference signal $+\frac{1}{2}$ A and a logical 0 will be entered otherwise.

The latches 178 and 184 thus provide a 2 bit merge indicator signal, the most significant bit of which is expressed by the latch 178, which can take on three possible values. For a + merge in which the difference between the contents of the sample and hold circuit 158 and a sample value is larger than $+\frac{1}{2}$ A, the merge indicator signal will have the value 10; for a—merge in which the difference between the contents of the sample and hold circuit 158 and a sample value is less than $-\frac{1}{2}$ A, the merge indicator signal will have the value 01; and, for a "no merge" condition in which the difference between the contents of the sample and hold circuit 158 and a sample value is between $-\frac{1}{2}$ A and $+\frac{1}{2}$ A, the merge indicator signal has the value 00.

As noted above, the sum and difference between each sample value and the reference signal are presented to the sample and hold circuit 158 for entry by signals on the signal paths 168 and 170 respectively to the control terminals of the switches 160 and 162. One of these signals is supplied during a half READ clock period that occurs a half READ clock period following the generation of the merge indicator signal if either a + merge or a − merge is detected. More particularly, an AND gate 186, whose output provides the signal on signal path 168 to the switch 160, receives the bit of the merge indicator signal at the Q output of the latch 178 and the complement of the ODD SAMPLE & HOLD clock signal on the signal path 136 via an inverter 188 and signal path 190. Thus, at such times that a + merge condition occurs, the AND gate 186 will be enabled during a time period in which the ODD SAMPLE & HOLD clock signal is low to cause entry of the sum of the sample currently stored in the even sample and hold circuit 98 and the reference signal into the sample and hold circuit 158. As shown by the timing diagrams of FIG. 4, such time period begins with the entry of the merge indicator signal into the latches 178 and 184 and terminates a half READ clock cycle later. The difference between the sample value and the reference signal is similarly entered into the sample and hold circuit 158 by enabling an AND gate 192 each time a—merge condition occurs to give rise to a logical 1 at the Q output of the latch 184. To this end, one input of the AND gate 192 receives the complement of the ODD SAMPLE & HOLD clock signal of the signal path 190, the other input is connected to the Q output terminal of latch 184 and the output of the AND gate 192 is connected to the control terminal of the switch 162 via the signal path 170.

Before continuing with the description of the components of the even Viterbi decoder 130, it will be useful to make a brief remark concerning the type of technologies that might be employed in the construction of the maximum likelihood detector of the present invention. An important consideration underlying the use of PRML in a disc drive is the potential that PRML has for increasing the transfer rate of data to and from a data track. To fully achieve this potential, the present invention contemplates the portions of the Viterbi decoders described above may be implemented in fast technologies such as current mode logic (CML) that will permit very large transfer rates to be employed in a disc drive that makes use of the present invention. However, components that employ CML draw relatively large currents that are undesirable in a system implemented utilizing very large scale integration techniques. Thus, where CML is used, it is contemplated that it will be used sparingly on an as needed basis. As a practical matter, it is contemplated that the portions of the Viterbi decoders described above may make use of CML technology but remaining portions are preferably implemented in CMOS logic. In such case, the comparison circuit 174 will include CML to CMOS conversion circuits (not shown) that are connected to the Q outputs of the latches 178 and 184 to provide the merge indicator signal in a form suitable for use the circuitry now to be described.

Figure 6:
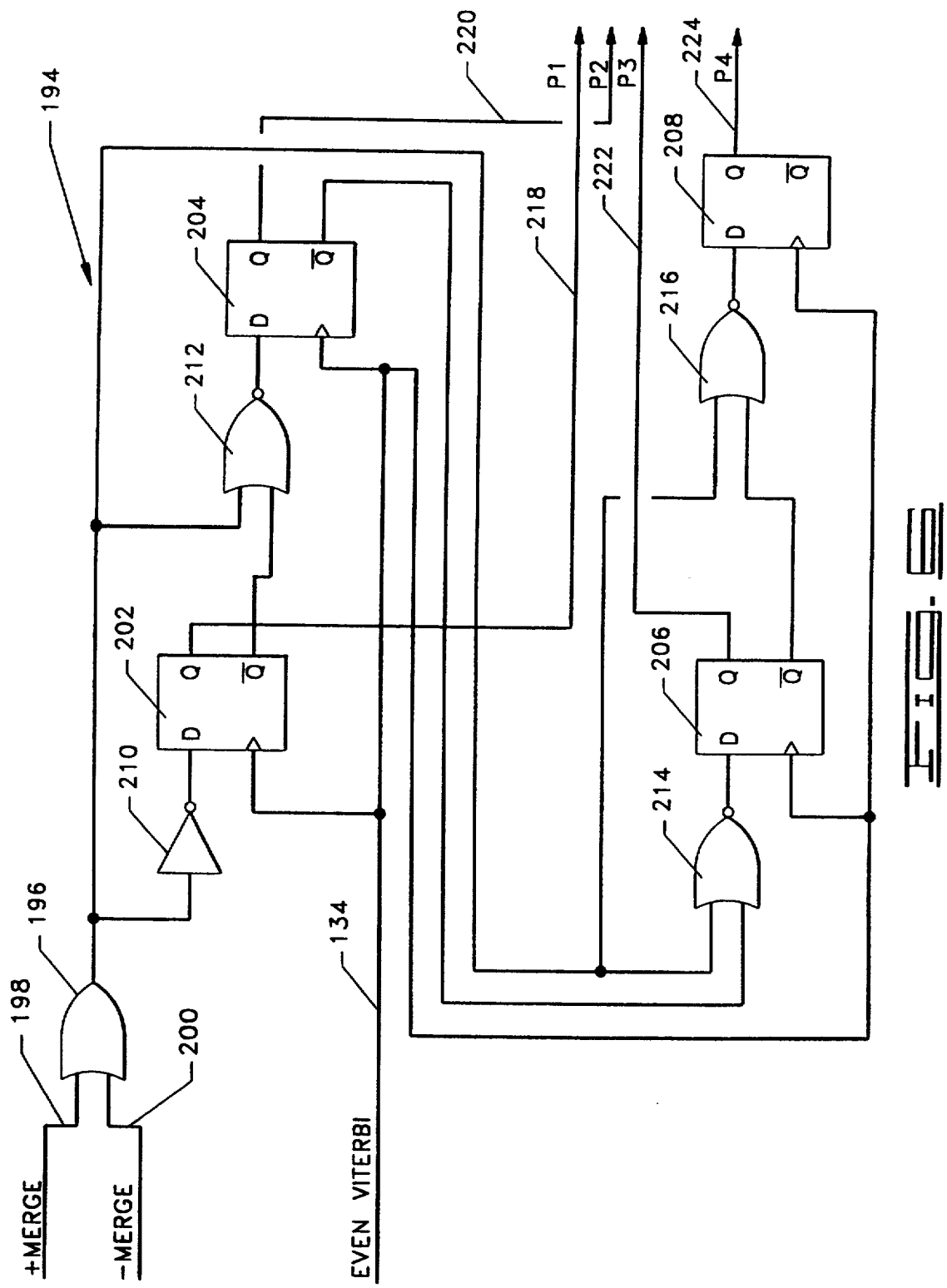
FIG. 6 is a block diagram of the even Viterbi decoder pointer.

Referring now to FIG. 6, the Viterbi decoder 130 is further comprised of a pointer 194 which, for purposes to be discussed below, stores indications of the detection of no merge conditions by the comparison circuit 174. To this end, the pointer 194 is comprised of an OR gate 196, having inputs that are connected to the Q outputs of the latches 178 and 184 via signal paths 198 and 200 respectively that have been carried into FIG. 6 from FIG. 5, to detect the 00 merge indicator signal that marks the no merge condition and a plurality of type D flip flops 202, 204, 206 and 208 in which indications of no merge conditions for successive even samples are stored.

In addition to the OR gate 196 and the flip flops 202, 204, 206 and 208, the pointer 194 is comprised of an inverter 210 connected between the output of the OR gate 196 and the data input of the flip flop 202 and NOR gates 212, 214 and 216 that interconnect successive storage locations of the pointer formed by the succession of flip flops 202, 204, 206 and 208. More particularly, one input of the NOR gate 212 is connected to the $\bar{Q}$ output of the flip flop 202 and the output of the NOR gate 212 is connected to the data input of the flip flop 204; one input of the NOR gate 214 is connected to the $\bar{Q}$ output of the flip flop 204 and the output of the NOR gate 214 is connected to the data input of the flip flop 206; and one input of the NOR gate 216 is connected to the $\bar{Q}$ output of the flip flop 206 and the output of the NOR gate 216 is connected to the data input of the flip flop 208. With these connections, indications of the detection of no merge conditions for a series of samples will be provided on signal paths 218, 220, 222 and 224 in accordance with an operating scheme that has been presented in the form of a state diagram in FIG. 7.

Referring to FIG. 7, the state of the pointer 194 is defined by the logical values of bits on the signal paths 218, 220, 222 and 224 and five states 226, 228, 230, 232 and 234, described by 4 bit binary numbers in which the most significant bit, P1, is the logic value at the Q output of flip flop 202 and bits, P2, P3 and P4, of successively lesser significance are the logic values at the Q outputs of the flip flops 204, 206 and 208 respectively, can occur in the operation of the preferred form of the Viterbi decoder 130 that has been illustrated in the drawings. As shown in FIG. 7, the pointer 194 will return to the state 226 described by the number P1P2P3P4=0000 each time a +merge or −merge is detected as indicated by the transitions marked "Y" in FIG. 7 each time the flip flops 202, 204, 206 and 208 are clocked by an EVEN VITERBI clock signal that appears on the signal path 134 from the clock generator 94. In the absence of +merge or −merge indications at the outputs of the latches 178, 184 of the comparison means 174, the pointer will successively pass through the states described by the binary numbers P1P2P3P4=1000, 1100, 1110 and 1111 in response to the EVEN VITERBI clock signal. As shown in FIG. 4, the EVEN VITERBI clock signal follows the EVEN LATCH HOLD clock signals by one half the period of the READ clock so that the merge indicator signal generated by the comparison circuit 174 when a sample of the signal in the read channel 30 is taken will have been entered before the pointer 194 is clocked.

Figure 8:
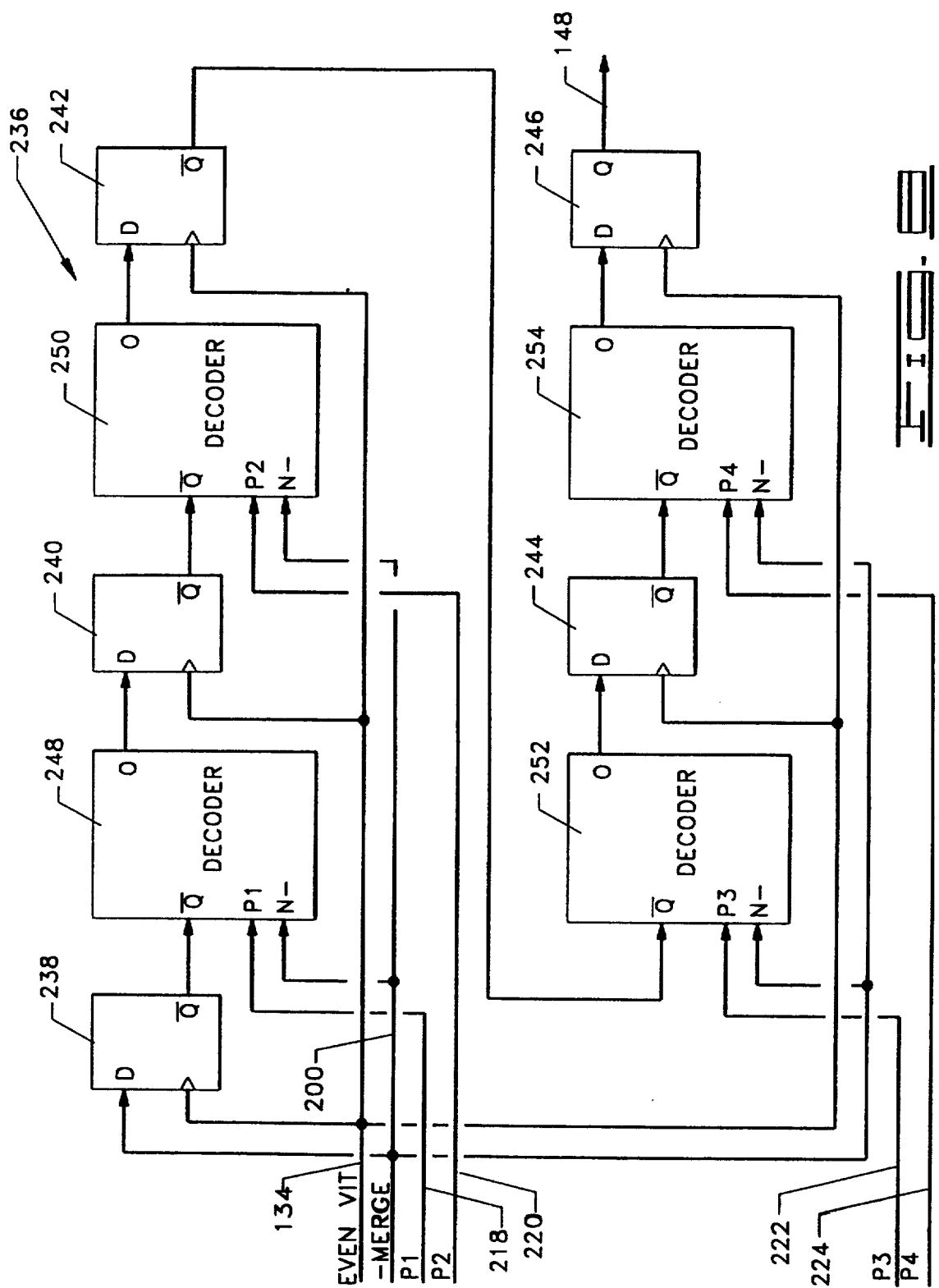
FIG. 8 is a block diagram of the even Viterbi decoder shift register.

Referring now to FIG. 8, shown therein and designated by the reference numeral 236 is a shift register of which the even Viterbi decoder 130 is further comprised. As shown in FIG. 8, the shift register 236 is comprised of type D flip flops 238, 240, 242, 244 and 246 that are interconnected by decoders 248, 250, 252 and 254. More particularly, each decoder has an input, indicated by the symbol $\bar{Q}$ in FIG. 8, that is connected to the $\bar{Q}$ output of the flip flop that constitutes the shift register stage preceding the decoder and an output, indicated by the symbol O in FIG. 8 that is connected to the data input of the flip flop that constitutes the shift register stage that follows the decoder.

Additionally, each decoder has a—merge input, indicated by M— in FIG. 8 that is connected to the Q output of the latch 184 of the comparison circuit 174 shown in FIG. 5 via the signal path 200 that has been carried into FIG. 8 from FIG. 4. Each of the decoders has a further input, indicated as P1 for the decoder 248, P2 for the decoder 250, P3 for the decoder 252 and P4 for the decoder 254, that are connected to the storage locations provided by the flip flops 202, 204, 206 and 208 respectively of the pointer 194 via the signal paths 218, 220, 222 and 224 that have been carried into FIG. 8 from FIG. 6. Consequently, successive decoders 248, 250, 252 and 254 receive the successive indications of the detection of "no merge" conditions that are stored in the pointer 194 in the manner that has been described above.

The truth table for the decoders 248, 250, 252 and 254 has been presented in Table I.

TABLE I

| M- | P(i) | $\bar{Q}$ | O |
|---|---|---|---|
| 1 | 1 | x | 1 |
| 1 | 0 | 0 | 1 |
| 1 | 0 | 1 | 0 |
| 0 | X | 0 | 1 |
| 0 | X | 1 | 0 |

As can be seen from Table I, each decoder transmits a logical 1 to the data input of the succeeding latch of the shift register 236 at such times that the logic value at the output the flip flop 184 of the comparison circuit is 1 and the "no merge" indication received from the pointer is a logical 1. Otherwise, the decoder transmits the complement of the logical value received from the preceding flip flop of the shift register 236. Consequently, each time the shift register 236 is clocked, by an EVEN VITERBI clock signal received on signal path 134 that has been carried into FIG. 8 from FIG. 3; that is, by a clock signal that rises a half READ clock period after the merge indicator signal has been entered into the latches 178 and 184 of the comparison circuit 174, the logic value at the $\bar{Q}$ output of one flip flop (stage) of the shift register 236 will be shifted to the $\bar{Q}$ output of the next shift register stage in the absence of logical 1's received from both the pointer 194 and the comparison circuit 158. In the latter case, a logical 0 is shifted to the $\bar{Q}$ output of the next shift register stage.

The Q output of the last flip flop 208 of the shift register 194 is connected to the postcoder 146 shown in FIG. 3 via the signal path designated by the reference numeral 148 in both FIGS. 3 and 8.

Operation of the Viterbi Decoder

As has been indicated above, it is contemplated that the Viterbi decoders 130 and 138 are utilized in a disc drive having a recording channel which employs partial response signaling and maximum likelihood detection in the storage and retrieval of data from a rotating disc of the disc drive. Consequently, a few remarks concerning the recording channel 20 of FIG. 1 will serve the useful purpose of placing the operation of the Viterbi decoders 130 and 138 in a context which will facilitate an understanding of the present invention.

Referring to FIG. 1, it is contemplated that the preferred embodiment of the present invention, that described herein, will be used with an encoder 32 which encodes user data to satisfy an (0,4/4) constraint; that is, a constraint in which the minimum number of logical 0's between consecutive logical 1's in the encoded data is 0, the maximum number of logical 0's between any two consecutive logical 1's in the encoded user data is four and the maximum number of logical 0's between any two consecutive logical 1's of even and odd subsequences of the encoded data is similarly four. While this last constraint parameter is presently preferred, a different parameter can be selected by adjusting the number of flip flops in the pointer 194 and the shift register 236. More particularly, the number of flip flops in the pointer 194 is selected to be equal to the maximum number of logical 0's between logical 1's in the even and odd subsequences of the encoded user data and the number of flip flops in the shift register 236 is selected to exceed such maximum number of logical 0's between successive logical 1's in the even and odd subsequences by one. The purpose underlying such criterion will become clear below.

It is further contemplated that the precoder 42 will further encode the encoded user data, the sequence {a} referred to above, to the above noted sequence {b} in accordance with equation (1) above and that the write driver 50 passes a current through the R/W head in a direction that is determined by the logical value of the member of the sequence {b} presently being received by the write driver 50. Consequently, when a user file is stored to a data track 26, the data track 26 will be magnetized as a sequence of data elements in which the directions of magnetization of the data elements can be expressed by the sequence {b}. Consequently, should it be possible to determine the sequence of data elements along the data track, the encoded user data file could be recovered by XORing consecutive members of the even and odd subsequences of data elements in accordance with equation (2) and multiplexing the subsequences. The purpose of the Viterbi decoders 130 and 138 are to generate even and odd subsequences of logical values that are most likely to be the data elements that were magnetically recorded when the encoded and precoded user file was stored.

As is known in the art, the "most likely" subsequences are determined in relation to a selected criterion and the criterion that underlies the construction of the Viterbi decoders 130 and 138 is based on the assumption that noise in the read channel 30 will be "white noise". With such an assumption, the criterion that determines the most likely sequence of all possible sequences of data elements that might have been written to the data track 26 when a file was stored is that sequence which will minimize the sum of squares of the difference between actual sample values of the signal issuing from the filter 64 and ideal values for the samples as determined by the partial response wave form to which signals induced in the R/W head 54 are filtered. In the present invention, such partial response wave form is the class IV wave form that has been discussed in the aforementioned article by Ferguson entitled "Optimal Reception for Binary Partial Response Channels". In the present invention, the even Viterbi decoder 130 of the present invention determines the even subsequence of this most likely sequence and the odd Viterbi decoder determines the odd sub sequence of this most likely sequence.

Following Ferguson, the criterion can be expressed in a different way that permits application of the criterion as each new sample of the signal in the read channel is taken. More particularly, representing the sample corresponding to the nth data element by y(n), the most likely sequence will include one of two possible values for the data element n-2 if the quantity $\Delta(n-2)-y(n)$ is greater than $+\frac{1}{2}$ A and the most likely sequence will include the other of these values for the data element if the quantity $\Delta(n-2)-y(n)$ is less than $-\frac{1}{2}$ A, where $\Delta(n-2)$ is a so-called difference of survivor metrics that is updated each time the value of a data element for the most likely sequence is determined. (Ferguson uses +1 in place of $+\frac{1}{2}$ A.) The first of these two conditions is referred to as a +merge and the second as a −merge. If neither condition is met, that is, a "no merge" condition, then the most likely sequence of data elements will include the same values for the data elements (n-2) and n. The updating of the quantity $\Delta$ is effected in accordance with the following conditions:

1. If a +merge is detected when the sample y(n+2) is taken, $\Delta(n+2)$ is updated to $y(n+2)+\frac{1}{2}$ A.
2. If a −merge is detected when the sample y(n+2) is taken, $\Delta(n+2)$ is updated to $y(n+2)-\frac{1}{2}$ A.
3. In the absence of detection of a merge, the value of $\Delta(n)$ is used for $\Delta(n+2)$.

In the present invention, the sample and hold circuit 158 of the even viterbi decoder 130 is utilized to store the value of the survivor metric difference to be used in the merge test when a new sample is received from the sample and hold circuit 98 of the timing and gain control circuit 35. Thus, for example, when the sample having a signal strength y(n+2) is received, the sample and hold circuit 158 will contain an analog signal whose strength provides a measure of the quantity $\Delta(n)$ that was determined when the most recent merge condition was detected. Using this stored signal strength and the signal strength of the sample, the subtracter 172 generates a signal having the signal strength $\Delta(n)-y(n+2)$ and the comparison circuit 174 compares this signal and its negative, generated by the amplifier 180, to the reference signal $\frac{1}{2}$ A. If the difference A (n)-y(n+2) is greater than $+\frac{1}{2}$ A, the output of the comparator 176 will be substantially the maximum voltage provided by the power supply used for the disc drive of which the recording channel 20 is a part; otherwise the output of the comparator 176 will be at substantially the power supply ground. Similarly, if the negative of the difference $\Delta(n)-y(n+2)$ is greater than the reference voltage $\frac{1}{2}$ A; i.e., the difference $\Delta(n)-y(n+2)$ is less than $-\frac{1}{2}$ A, the voltage at the output of comparator 182 will be substantially the maximum voltage provided by the disc drive power supply. Otherwise, the voltage at the output of comparator 182 will be substantially the power supply ground.

As noted above, the even samples are entered by rising edges of the EVEN SAMPLE & HOLD clock shown along time line 110 of FIG. 4 and the latches 178 and 184 are clocked by rising edges of the EVEN LATCH HOLD clock that follow the rising edges of the EVEN SAMPLE & HOLD clock signals by one half of the period of READ clock shown on time line 96. Consequently, when the EVEN LATCH HOLD signal rises, the latches 178 and 184, which receive the voltage levels at the outputs of the comparators 176 and 182 respectively at their data inputs, will generate a two bit digital merge indicator signal that is determined by the magnitudes of the difference signal $\Delta(n)-y(n+2)$ and reference levels $\pm\frac{1}{2}$ A. Specifically, the merge indicator signal will be expressed as 10 if the difference is greater than $+\frac{1}{2}$ A, 01 if the difference is less than $-\frac{1}{2}$ A and 00 if the difference lies between $+\frac{1}{2}$ A where the most significant bit of the merge indicator signal is the logic value expressed by the voltage, substantially the power supply maximum or substantially the power supply ground, at the Q output of the latch 178. Utilizing the definitions of the +merge and −merge conditions given above, a +merge is indicated by a merge indicator signal 10, a −merge condition is indicated by a merge indicator signal 01 and a no merge condition is indicated by a merge indicator signal 00.

As noted above, the Viterbi algorithm contemplates that the value of the survivor metric difference; i.e., the quantity Δ stored in the sample and hold circuit 158 will be updated each time a merge is detected and such updating is effected by transmitting the most significant bit of the merge indicator signal to the AND gate 186 that controls the operation of the switch 160 and transmitting the least significant bit of the merge indicator signal to the AND gate 192 that controls the switch 162. Consequently, if a merge is detected one of the AND gates 186, 192 will be enabled, following entry of the merge indicator signal into the latches 178 and 184, by the clock signal received from the inverter 188 one half READ clock period later to close one of the switches 160 or 162 and thereby enter either the sum or the difference of the sample magnitude and the reference level ½Δ into the sample and hold circuit 158 from the adder 154 or the subtracter 156. If no merge is detected, neither AND gate 186 or 192 will be enabled following reception of the sample y(n+2) so that the switches 160 and 162 remain open and the value of the survivor metric difference Δ remains unchanged so long as the sample y(n+2) remains in the even sample and hold circuit 98 of the timing and gain control circuit 35.

The above sequence of events will be repeated for every even cycle of operation of the READ clock so that the operation of portions of the even Viterbi decoder 130 shown in FIG. 5 will be to repetitively execute the merge test, generate the merge indicator signal that specifies the results of the test and update the value of the survivor metric difference if either type of merge is detected. The odd Viterbi detector 138 carries out the same procedure for odd cycles of operation of the READ clock.

As is known in the art, the underlying principle of the Viterbi algorithm is that a merge determines the most likely value for the data element corresponding to the even or odd sample period that precedes the even or odd sample period in which the merge test is carried out while the absence of a merge indicates that the most likely value of the data element corresponding to the present even or odd sample period is the same as the most likely value of the data sample corresponding to the previous even or odd sample period. Consequently, the Viterbi algorithm contemplates that a tentative sequence of data element values be saved between merge detections and used to determine the most likely sequence whenever a merge is detected for determination of the most likely sequence of encoded data elements that were written to the data track when a user file was stored. The pointer 194 and shift register 236 provide an effective means for storing and, if necessary, correcting a tentative sequence of even data element values between the detection of merges in a manner that furthers the objective of providing a reliable PRML recording channel that avoids the use of complex and, consequently, expensive circuitry.

Referring FIGS. 5 and 8, the detection of a −merge will be indicated by logical 1 at the Q output of the latch 184 of the comparison circuit and such logic value will be transmitted to the D input of the flip flop 238 that constitutes the first stage of the shift register 236 via the signal path 200. Consequently, when the EVEN VITERBI clock signal on the signal path 134 to the clock input of the flip flop 238 rises a half READ clock cycle after the entry of the merge indicator signal in the latches 178 and 184, as shown by the timing diagrams in FIG. 4, a logical 1 will be clocked into the Q output of the flip flop 238 to clock a logical 0 into the $\overline{Q}$ output of flip flop 238. On the other hand, should a +merge occur, the output of the latch 184 will remain low so that a logical 0 will be clocked into the $\overline{Q}$ output of the flip flop 238 to clock a logical 1 into the $\overline{Q}$ output of the flip flop 238. Thus, a logical 1 at the $\overline{Q}$ output of the flip flop 238 corresponds to a data element value that is determined by a +merge and a logical 0 at the $\overline{Q}$ output of the flip flop 238 corresponds to a data element value that is determined by a −merge.

It will be noted that it is the absence of the detection of a −merge that causes a logical 1 to be clocked into the $\overline{Q}$ output of the flip flop 238 of the shift register 236. Thus, so long as a −merge is not detected, logical 1's are clocked into the $\overline{Q}$ output of the flip flop 238 as successive samples of the signal in the read channel 30 are taken. In accordance with the last line of table I, a logical 1 at the $\overline{Q}$ output of flip flop 238 will present a logical 0 to the data input of flip flop 240 to cause a logical 1 to be clocked into the $\overline{Q}$ output of the flip flop 240 in response to an EVEN VITERBI clock signal on the path 134 of FIG. 8. Similarly, so long as no −merge condition is detected, logical 1's at the $\overline{Q}$ outputs of flip flops 240, 242 and 244 will be clocked into the $\overline{Q}$ outputs of flip flops 242, 244 and 246 respectively.

Consequently, should a succession of samples for which no merge is detected occur, each of such occurrences will result in the clocking of a logical 1 into the $\overline{Q}$ output of the flip flop 238 coupled with the shift of the logical 1's so entered into succeeding stages of the shift register 236. Concurrently, the absence of merges for these samples will result in the pointer 194 following "N" transition lines of the state diagram shown in FIG. 5 so that the pointer 194 will point to all of the logical 1's that have been entered into shift register 236 in the absence of the detection of merge conditions.

Should a +merge subsequently occur, all of the logical 1's that have been entered during the succession of "no merges" will be identified as corresponding to a series of data elements having a value which, as noted above, corresponds to a logical 1 at the $\overline{Q}$ output of the flip flop 238. Thus, the $\overline{Q}$ outputs of a number of successive stages of the shift register equal to the number of samples for which the no merge and subsequent +merge conditions have been detected will all be logical 1's indicating a series of data elements having one of the two values that correspond to the directions for the magnetizations of the successive segments of the data track 26 to which the data elements are corresponded. Moreover, as indicated by the state diagram of FIG. 5, the pointer 194 will be reset so that the pointer 194 can never again point to these logical 1's. Thus, according to the last four lines of Table I, these logical 1's will be eventually be shifted to the flip flop 246 for transmission of the complement of these logic values to the postcoder 146 for postcoding by XORing successive pairs of the logic values as described above. But, since these values are identical, the result of the postcoding will be a series of logical 0's which is in accord with equations (1) and (2) which indicate that, during writing, successive segments of the data track 26 will be magnetized in the same direction by a succession of logical 0's in the encoded user data.

If, on the other hand, following a series of sample times in which no merges are detected, a −merge occurs, then, since the −merge is indicated by a logical 1 on the signal path 200 from the Q output of the latch 184, a logical 0 will be entered into the $\overline{Q}$ output of the flip flop 238. Moreover, in accordance with the second line of Table I and the operation of a type D flip flop to shift a logical 0 into the $\overline{Q}$ output in response to a logical 1 at the data input, the logical 1's that have been saved during the occurrence of the series of "no merges" will be complemented as they are shifted into the next stage of the shift register 236. At the same time, the pointer 194 will be reset so that these logical 0's will be subsequently shifted down the shift register 236 without regard to subsequent merge or no merge conditions that may occur. Consequently, with one exception, the sequence of logical 0's will be postcoded as logical 0's in the sequence of encoded user data bits as is consistent with equations (1) and (2) and the operation of the write driver 50 described above. (The connection of the Q, instead of $\overline{Q}$, data output of the flip flop 246 to the postcoder has been ignored. The data elements are XORed to recover the most likely estimate of encoded user data bits and the truth table for the complements of two variables is identical to the truth table for the variables.) The exception is a logical 0 that follows a logical 1 of a previous sequence of data elements that have been determined to be members of the most likely sequence of data elements in accordance with the criteria given above. Consistently with equations (1) and (2), the postcoding for these two data elements will yield a logical 1 in the data series returned from maximum likelihood detector 22. The same, of course, will be true for a logical 1 that follows a logical 0 in the shift register 236. Consequently, if the most likely sequence of data elements determined by the Viterbi decoders 130 and 138 of the maximum likelihood detector reflects the sequence of magnetizations of the segments of track that were produced when a file was stored, the sequence of data bits generated by the maximum likelihood detector 32 will be the sequence {a} derived by encoding the user file so that the decoder 74 of FIG. 1 will regenerate the user file.

It will further be noted that, according to equation (2), an encoded user data bit having the logic value 1 will give rise to segments of the data track 26 that are magnetized in opposite directions. Consequently, since the most likely sequence of data elements determined by Viterbi decoders will yield logical 1's at the output of the maximum likelihood detector 22 for those samples for which a merge occurs but not for those samples for which a merge does not occur, logical 1's in the encoded user data when that data is written are corresponded to merges that occur in the sequence of sample periods when the data track is read. Consequently, a limitation in the number of logical 0's between successive logical 1's in the encoded user data will limit the number of sample periods that can occur between merge detections. More particularly, by limiting the number of logical 0's between successive even or odd subsequences in the encoded user data to four, the maximum number of sample periods that can occur between the detection of a merge is limited to four. Thus, by providing the shift register 236 with five stages, the sequence of bits that reach the last stage of the shift register are caused to be the most likely sequence of data elements that are determined in accordance with the Viterbi algorithm without regard to the sequence of bits that are entered into the initial stage 238 of the shift register 236. That is, a merge must occur, at the latest, in a sample for which a bit whose value may not reflect the most likely sequence of data elements is to be shifted into the flip flop 246. If the merge is a +merge, the bit will be proper and will be shifted into the flip flop without change. If the merge is a −merge, indicating that the logical 1's that have been shifted down the stages of the shift register do not reflect the most likely sequence of data elements, the decoder 254 will present a logical 1 to the data input of the flip flop 246 at the time the merge indication signal is entered into the latches 178 and 184 by the EVEN LATCH HOLD clock signal. When, a half READ clock cycle later, the EVEN VITERBI clock signal rises, a logical 0 will be shifted into the $\overline{Q}$ output of the flip flop 246. Consequently, the sequence of logical values presented at the Q output of the flip flop 246 will generally exhibit a one-to-one correspondence with the most likely sequence of data elements determined in accordance with the Viterbi algorithm.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A maximum likelihood detector for determining the most likely sequence of bits of data recorded on a disc drive data track as a sequence of magnetically written data elements from even and odd subsequences of samples of a signal generated from said data elements, comprising:

an even Viterbi decoder for receiving the even sample subsequence and generating the most likely values of the even subsequence of data elements; and an odd Viterbi decoder for receiving the odd sample subsequence and generating the most likely values of the odd subsequences of data elements; and means, connected to the even and odd Viterbi decoders, for generating the sequence of bits recorded data from the most likely values of the even and odd subsequences of data elements;

wherein each of the Viterbi decoders comprises:

an analog adder for adding a reference signal to each sample received by the Viterbi decoder;

an analog subtracter for subtracting said reference signal from each sample received by the Viterbi decoder;

a sample and hold circuit connected to the adder and the subtracter and operable for storing the sum of the sample and reference signal in response to a first update signal and for storing the difference of the sample and reference signal in response to a second update signal;

difference means for generating a difference signal indicative of the difference between the contents of the sample and hold circuit and each sample received by the Viterbi decoder;

comparison means, connected to the output of the difference means, for comparing the difference signal to said reference signal as generating a two-bit digital merge indicator signal indicative of the magnitude of the difference signal in relation to the reference signal and the negative of the reference signal, a first bit of merge indicator signal having a first logical value at such times that the difference signal is greater than the reference signal and a second logical value at such times that the difference signal is less that the reference signal, and a second bit of the merge indicator signal having the first logical value at such times that the difference signal is less than the negative of the reference signal and the second logical value at such times that the difference signal is greater than the negative of the reference signal;

sample and hold update means connected between the comparison means and the sample and hold circuit for providing the first update signal to the sample and hold circuit at such times that the logical value of the first bit of the merge indicator signal is the first logical value and for providing the second update signal to the sample and hold circuit at such times that the logical value of the second bit of the merge indicator signal is the first logical value;

pointer means, connected to the comparison means, for storing, in successive storage locations, indications of successive samples received by the Viterbi decoder for which both bits of the merge indicator signal have the second logical value; and a shift register comprising a series of flip flops interconnected by decoders, wherein the first flip flop and each decoder are connected to the comparison means to receive one bit of said merge indicator signal, wherein successive decoders are connected to successive storage locations of the pointer means, and wherein each decoder is characterized as a means for transmitting a bit having a selected logical value to the succeeding flip flop of the shift register in response to reception from the pointer means of an indication of a sample for which both bits of the merge indicator signal have the second logical value in combination with a selected logical value of the bit received from the comparison means and for otherwise transmitting a logical value determined by the logical value of a bit received from the flip flop of the storage register preceding the decoder.

2. A Viterbi decoder for determining the most likely values of a sequence of magnetically written data elements giving rise to a signal in a read channel of a disc drive from a sequence of samples of said signal, comprising:

an adder for adding reference signal to each sample;

a subtracter for subtracting said reference signal from each sample;

a sample and hold circuit connected to the adder and the subtracter and operable for storing the sum of the sample and reference signal in response to a first update signal and for storing the difference of the sample and reference signal in response to a second update signal;

difference means for generating a difference signal indicative of the difference between the contents of the sample and hold circuit and each sample;

comparison means, connected to the output of the difference means, for comparing the difference signal to said reference signal and generating a two-bit digital indicator signal indicative of the magnitude of the difference signal in relation to the reference signal and the negative of the reference signal, a first bit of merge indicator signal having a first logical value at such times that the difference signal is greater than the reference signal and second logical value at such times that the difference signal is less that the reference signal, and a second bit of the merge indicator signal having the first logical value at such times that the difference signal is less than the negative of the reference signal and the second logical value at such times that the difference signal is greater than the negative of the reference signal;

sample and hold update means connected between the comparison means and the sample and hold circuit for providing the first update signal to the sample and hold circuit at such times that the logical value of the first bit of the merge indicator signal is the first logical value and for providing the second update signal to the sample and hold circuit at such times that the logical value of the second bit of the merge indicator signal is the first logical value;

pointer means, connected to the comparison means, for storing, in successive storage locations, indications of successive samples for which both bits of the merge indicator signal have the second logical value; and a shift register comprising a series of flip flops interconnected by decoders, wherein the first flip flop and each decoder are connected to the comparison means to receive one bit of said merge indicator signal, wherein successive decoders are connected to successive storage locations of the pointer means, and wherein each decoder is characterized as a means for transmitting a bit having a selected logical value to the succeeding flip flop of the shift register in response to reception from the pointer means of an indication of a sample for which both bits of the merge indicator signal have the second logical value in combination with a selected logical value of the bit received from the comparison means and for otherwise transmitting a logical value determined by the logical value of a bit received from the flip flop of the storage register preceding the decoder.

3. The Viterbi decoder of claim 2 wherein the comparison means comprises:

a first comparator for comparing the difference signal to the reference signal;

a unity gain, inverting amplifier connected to the difference means for generating a signal that is the negative of the difference signal;

a second comparator connected to the unity gain, inverting amplifier for comparing the negative of the difference signal to the reference signal, whereby the second comparator generates an indication of the relative magnitudes of the difference signal and the negative of the reference signal;

a first merge indicator bit storage latch connected to the output of the first comparator for storing the first bit of the merge indicator signal; and a second merge indicator bit storage latch connected to the output of the second comparator for storing the second bit of the merge indicator signal.

* * * * *

UNITED STATES PATENT AND TRADEMARK OFFICE
CERTIFICATE OF CORRECTION

PATENT NO. : 5,430,768
DATED : July 4, 1995
INVENTOR(S) : Vadim B. Minuhin, Vladimir Kovner, Steven V. Holsinger and Shafaollah Dahandeh It is certified that error appears in the above-indentified patent and that said Letters Patent is hereby corrected as shown below:

In the Abstract, line 14, delete "codected" and substitute therefor --connected--;

Column 7, line 25, delete "08/309,461" and substitute --08/309,761--;

Column 8, line 54, delete "08/309,461" and substitute --08/309,761--;

Column 15, line 54, delete "sub sequence" and substitute therefor --subsequence--; and Column 16, line 29, delete the second occurrence of "A" and substitute therefor -- $\Delta$ --.

Signed and Sealed this

Twelfth Day of December, 1995

Attest:

BRUCE LEHMAN

*Attesting Officer*  *Commissioner of Patents and Trademarks*